United States Patent [19]
Horstmann

[11] Patent Number: 5,748,095
[45] Date of Patent: May 5, 1998

[54] MINI FAULTED CIRCUIT INDICATOR UNIT

[75] Inventor: Hendrik Horstmann, Ratingen, Germany

[73] Assignee: Dipl.-Ing H. Horstmann GmbH, Germany

[21] Appl. No.: 680,454

[22] Filed: Jul. 15, 1996

[51] Int. Cl.[6] .................................................. G08B 21/00
[52] U.S. Cl. ........................... 340/664; 340/641; 324/542; 324/555; 324/556; 324/133
[58] Field of Search ..................................... 340/635, 641, 340/664, 662, 660, 661, 663; 324/542, 543, 555, 556, 127, 133

[56] References Cited

U.S. PATENT DOCUMENTS

| | | | |
|---|---|---|---|
| 3,771,049 | 11/1973 | Piccione | 340/664 |
| 3,991,366 | 11/1976 | Schweitzer, Jr. | 324/133 |
| 4,251,844 | 2/1981 | Horstmann | 361/1 |
| 4,288,743 | 9/1981 | Schweitzer | 324/127 |
| 4,338,595 | 7/1982 | Newman | 340/635 |
| 4,454,635 | 6/1984 | Russell | 24/462 |
| 4,456,873 | 6/1984 | Schweitzer, Jr. | 324/51 |
| 4,495,489 | 1/1985 | Schweitzer, Jr. | 340/664 |
| 4,694,599 | 9/1987 | Hart et al. | 40/449 |
| 4,873,706 | 10/1989 | Schweitzer, Jr. | 377/85 |
| 5,015,944 | 5/1991 | Bubash | 324/127 |
| 5,180,972 | 1/1993 | Schweitzer, Jr. | 324/127 |
| 5,397,982 | 3/1995 | Van Lankvelt | 324/126 |
| 5,497,096 | 3/1996 | Banting | 324/555 |

*Primary Examiner*—Jeffery Hofsass
*Assistant Examiner*—Ashok Mannava
*Attorney, Agent, or Firm*—Davis Chin

[57] ABSTRACT

A faulted circuit indicator unit for detecting an abnormally high electric current in an overhead cable includes a substantially rectangularly-shaped housing formed of front and back walls, opposed side walls, a closed bottom wall, and an open top mouth portion. Current sensing circuitry is disposed in a cavity formed in the housing for detecting the high current in the cable. An indication device is joined to the closed bottom wall of the housing and includes a visible indicator responsive to the current sensing circuit to produce a visual flashing light in the presence of the high current which is visible through a small aperture formed in the bottom wall thereof. The indication device is formed of an opaque hood whose central portion is connected around the bottom wall of the housing and a transparent stem joined also to the central portion of the hood and extends downwardly therefrom through which the flashing light is transmitted radially outwardly in all directions.

13 Claims, 4 Drawing Sheets

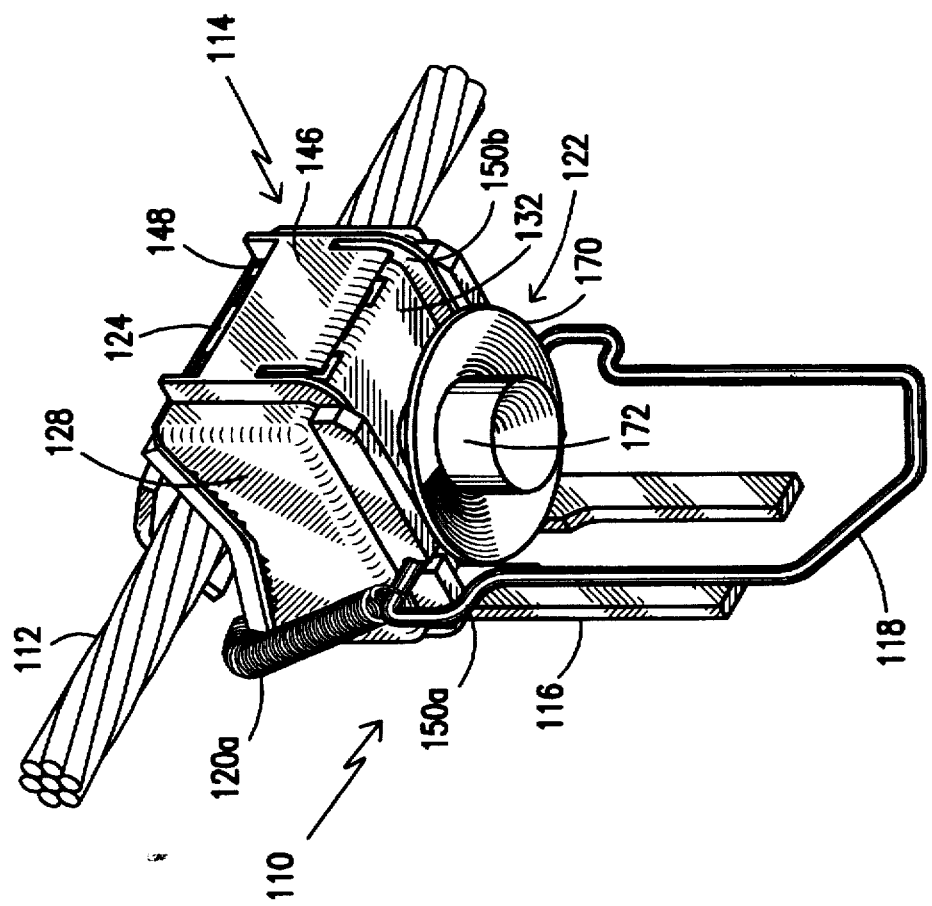
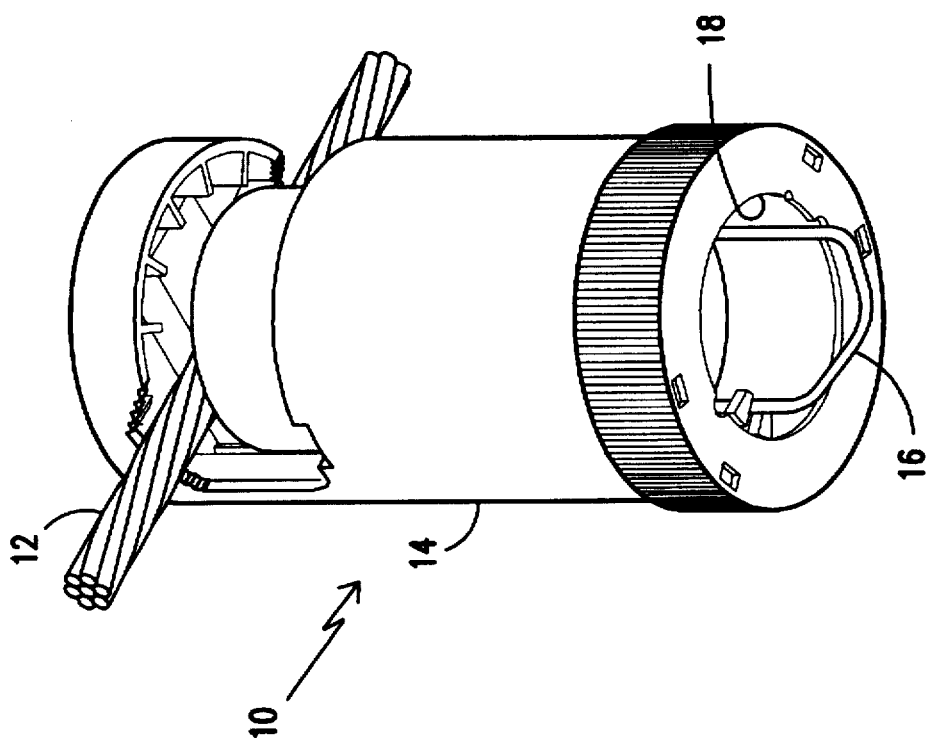
Fig. 2
Fig. 1 (PRIOR ART)

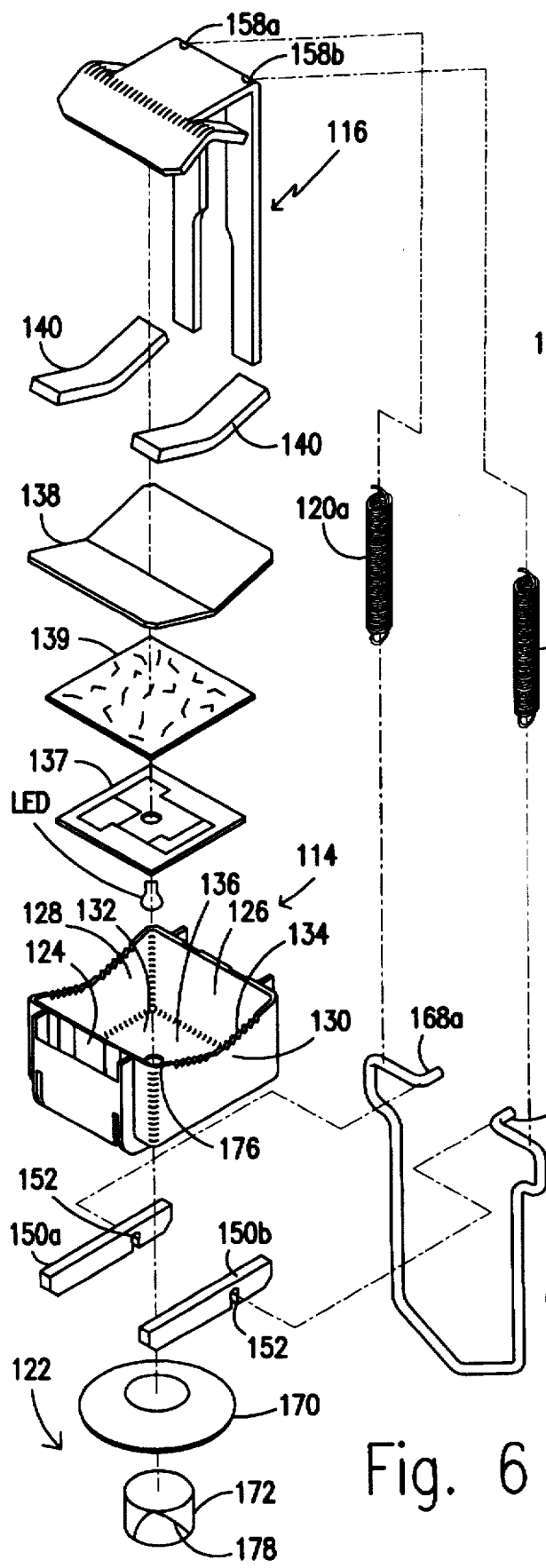
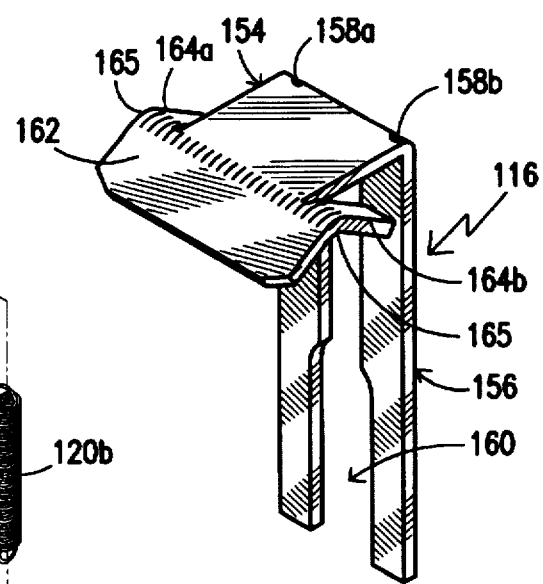
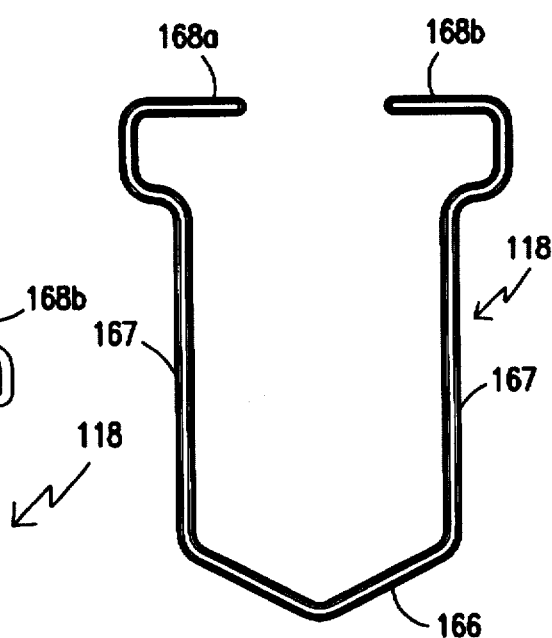
Fig. 6
Fig. 7
Fig. 8

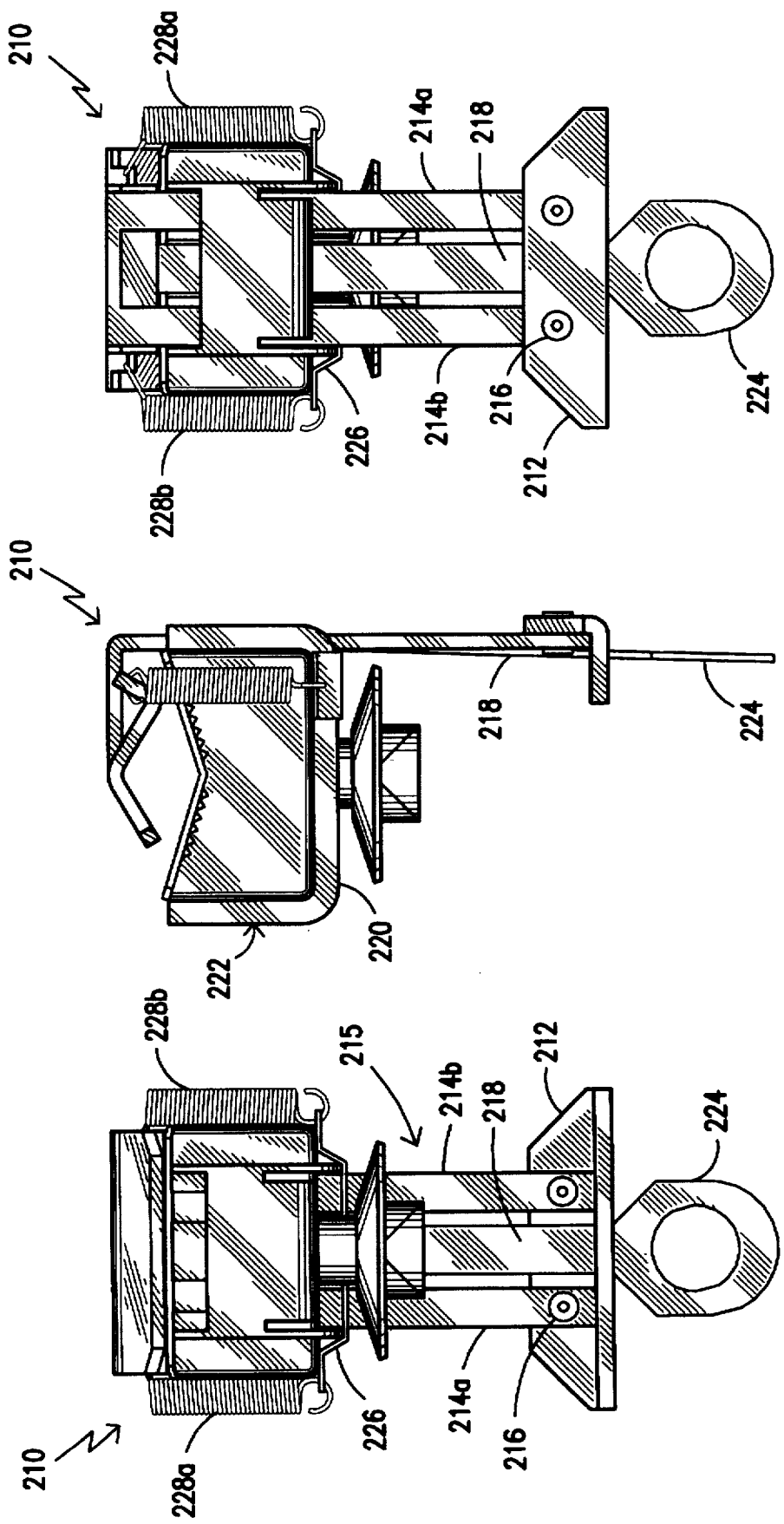

MINI FAULTED CIRCUIT INDICATOR UNIT

BACKGROUND OF THE INVENTION

This invention relates generally to faulted circuit indicators and more particularly, it relates to an improved faulted circuit indicator which has a unique miniaturized physical construction so as to provide enhanced visibility of an indicator.

The present faulted circuit indicator constitutes an improvement over the construction disclosed in application Ser. No. 940,497 filed Sep. 8, 1978, now U.S. Pat. No. 4,251,844 issued on Feb. 17, 1981, and assigned to the same assignee in the instant invention.

As is generally well-known in the art, there exists in recent years faulted circuit indicators of the type which are self-contained, self-powered units for being responsive to an abnormally high electric current in overhead power lines, conductors, cables, busbars and the like. Typically, these units include an indication device formed by means of flashing, extremely bright, light-emitting diodes (LEDs). Further, the units are generally installed or mounted about an energized conductor to be monitored by the use of a conventional shot-gun stick (hot-stick) which is utilized to separate a spring-biased mounting clamp for mounting over the energized conductor. Such a prior art device has been manufactured and sold by Dipl.-Ing. H. Horstmann GmbH of Heiligenhaus, Germany, under their designation CRAB Type 333 faulted circuit indicators.

In FIG. 1, there is illustrated a faulted circuit indicator 10 of the CRAB Type 333 made by Horstmann GmbH which is mounted about an overhead cable or conductor 12 in which the current passing therethrough is to be monitored. As can be seen, the faulted circuit indicator 10 has an essentially cylindrically-shaped housing 14 whose upper end is clamped over the cable 12. A wire/spring bail 16 extends from the bottom of the lower end of the housing 14 and is pullable by the conventional shot-gun stick for installation on the cable 12. The indication device in the form of one or more light-emitting diodes (not shown) are mounted in the recessed opening 18 formed in the lower end of the housing 14.

One drawback of the prior art device of FIG. 1 is that it is relatively large in size and thus is rather cumbersome to install about the overhead cables by a user. Another drawback is due to the fact that in order to examine visually the state of the light-emitting diodes of the faulted circuit indicator unit for determining the presence of a fault a repairman or technician is required to stand precisely underneath the unit. As a result, this has been a very laborious and time-consuming task for the repairman.

It would be desirable to provide a faulted circuit indicator unit which is designed to be of a miniaturized, compact construction so as to occupy a reduced amount of space. Further, it would be expedient to provide a faulted circuit indicator, which has an enhanced visibility of the LED indicator which can be observed quickly and readily by a technician standing at a predetermined distance from all of the sides of the unit. In this manner, the task of locating the fault along the cable is facilitated and can be made less time-consuming.

This invention represents a significant improvement over the prior art device of FIG. 1. The faulted circuit indicator unit of the present invention includes an indication device formed of an opaque hood and a transparent stem through which a visual flashing light is transmitted radially outwardly in all directions.

SUMMARY OF THE INVENTION

Accordingly, it is a general object of the present invention to provide an improved faulted circuit indicator unit which is relatively simple and economical to manufacture and assemble, but yet overcomes the disadvantages of the prior art devices.

It is an object of the present invention to provide a faulted circuit indicator unit which is designed to be of a miniaturized, compact construction so as to occupy a reduced amount of space.

It is another object of the present invention to provide a faulted circuit indicator unit which has an enhanced visibility of a LED indicator, thereby facilitating the location of the fault along the cable in less amount of time.

It is still another object of the present invention to provide a faulted circuit indicator unit which includes an indication device formed of an opaque hood and a transparent stem through which a visual flashing light is transmitted radially outwardly in all directions.

In accordance with these aims and objectives, the present invention is concerned with the provision of a faulted circuit indicator unit for detecting an abnormally high electric current in an overhead cable. The faulted circuit indicator unit includes a substantially rectangularly-shaped housing formed of front and back walls, opposed side walls, a closed bottom wall, and an open top mouth portion. The front and back walls, opposed side walls, and the closed bottom wall are all integrally connected together so as to define a cavity. A current sensing circuit is disposed in the housing for detecting the high current in the cable. An indication device is joined to the closed bottom wall of the housing.

The indication device includes a visible indicator responsive to the current sensing circuit to produce a visual flashing light in the presence of the high current which is visible through a small aperture formed in the bottom wall thereof. The indication device includes an opaque hood in which its central portion is connected around the bottom wall of the housing and a transparent stem joined also to the central portion of the housing and extends downwardly therefrom through which the flashing light is transmitted radially outwardly in all directions. As a result, the flashing light will be visually observable at a predetermined distance from all of the sides of the faulted circuit indicator unit.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a front, plan view of a prior art faulted circuit indicator unit;

FIG. 2 is a front, perspective view of a faulted circuit indicator unit, constructed in accordance with the principles of the present invention;

FIG. 6 is an exploded, perspective view of the faulted circuit indicator unit of FIG. 2;

FIG. 7 is a perspective view of the clamping member of FIG. 6;

FIG. 8 is a front, plan view of the wire/spring bail of FIG. 6; and

FIGS. 9 through 11 illustrate a second embodiment of a faulted circuit indicator of the present invention.

DESCRIPTION OF THE PREFERRED EMBODIMENT

Figure 4:
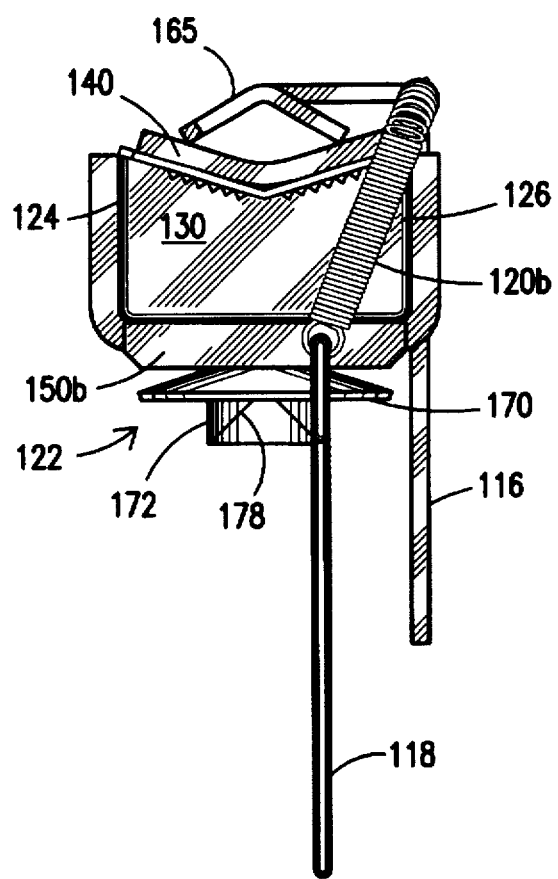
FIG. 4 is a side elevational view of the faulted circuit indicator unit.
Figure 3:
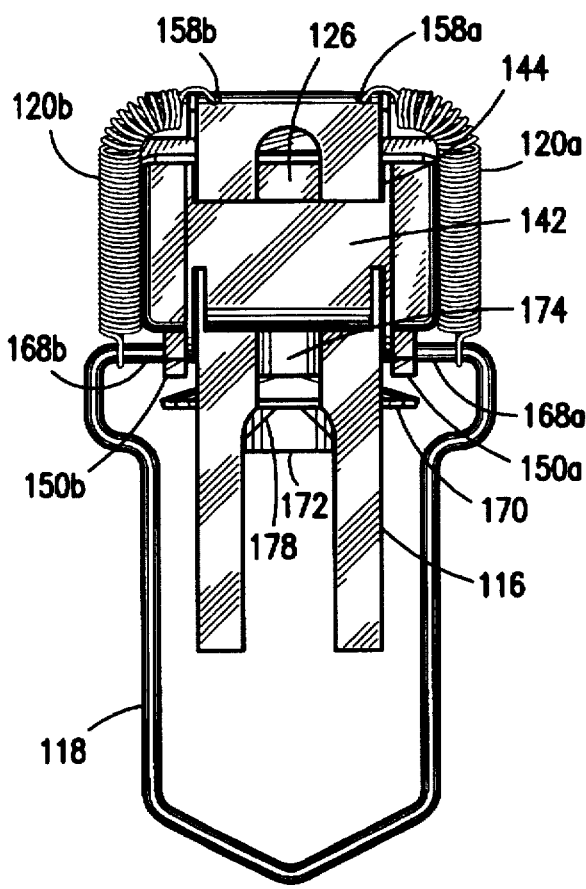
FIG. 3 is a back, plan view of the faulted circuit indicator unit.
Figure 5:
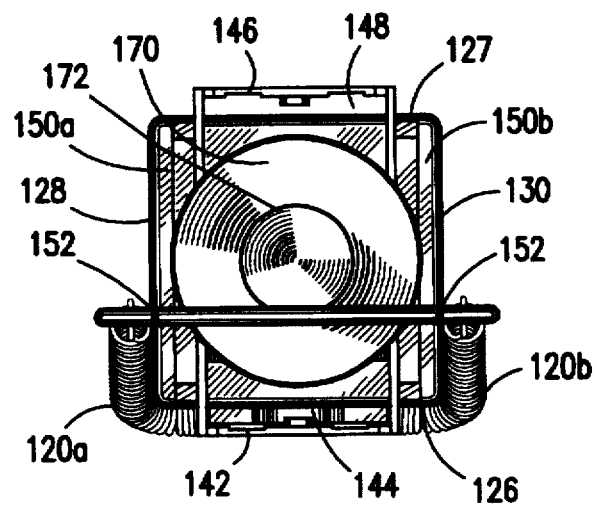
FIG. 5 is a bottom view of the faulted circuit indicator unit.

Referring now in detail to FIGS. 2 through 8 of the drawings, there is illustrated an improved faulted circuit indicator unit which is designated generally by reference numeral 110 and is constructed in accordance with the principles of the present invention. The faulted circuit indicator unit 110 is designed to be of a miniaturized, compact construction, which is relatively simple to manufacture and assemble. The faulted circuit indicator unit 110 is a self-contained, self-powered fault indicator type which houses suitably current sensing means for detecting an abnormally high electric current in an energized overhead power line or cable 112 and an indication device for producing a visual indication of the presence of the fault. The indication device of the present invention is visually observable not only through the bottom of the unit, but can be seen at a pre-determined distance from all sides of the unit. Consequently, the presence of the fault along the cable can be determined to be within a known section of the cable quickly and readily by technicians.

The faulted circuit indicator unit 110 is comprised of essentially a rectangularly-shaped housing 114, a L-shaped clamping bracket 116, a wire/spring bail 118, a pair of compression springs 120a, 120b, and an indication device 122. The housing 114 is used to encapsulate the current sensing means and the indication device and is formed of a suitable material in order to provide the necessary degree of structural strength such as a molded plastic material or a metallic material. The rectangularly-shaped housing includes opposed front and back walls 124 and 126; opposed side walls 128, 130; a closed bottom wall 132; and an open top mouth portion 134.

The front and back walls, the side walls, and the bottom wall are all integrally connected together so as to define a cavity 136 for receiving a printed circuit board 137 having the current sensing means and the indication device mounted thereon. After their insertion, the interior of the housing may be potted, i.e., cast in synthetic resin 139, synthetic plastic, or the like. A V-shaped lid member 138 is used to cover the mouth portion 134 so as to close the same and to seal the electrical elements within the housing in a fluid-tight engagement.

A pair of V-shaped cushion members 140 are disposed in a spaced apart relationship adjacent to the top edges of the side walls 128, 130. The cushion members 140 are preferably formed of an elastomeric, such as rubber.

A small plate 142 is spaced apart a small distance from the back wall 126 of the housing 114 so as to form a channel 144 therebetween. Similarly, a small plate 146 is spaced apart a small distance from the front wall 124 of the housing so as to form a channel 148 therebetween. A pair of opposed rib members 150a, 150b are formed on the bottom wall 132 adjacent to the respective side walls 128, 130 of the housing. Each of the rib members 150a and 150b includes an aperture or slot 152 disposed on its lower edge.

With reference to FIG. 7, the L-shaped clamping bracket 116 includes a shorter leg portion 154 and a longer leg portion 156 which is joined substantially perpendicularly to the shorter leg portion 154. At the junction of the leg portions on its outer edges, there are provided a pair of spring-receiving openings 158a, 158b. The longer leg portion 156 has a substantially U-shaped cut-out portion 160 in its intermediate portion. The leg portion 156 is receivable in the channel 144 and is held slidably therein. The free end of the shorter leg portion 154 terminates in a connecting portion 162 having narrow bight portions 164a, 164b joined integrally therewith. The connecting portion 162 and the bight portions 164a, 164b are bent downwardly from the horizontal plane of the shorter leg portion 154 so as to form inverted V-shaped sections 165. The outer ends of the V-shaped sections are adapted to rest upon the V-shaped cushion members 140 when the longer leg portion 156 is inserted through the channel 144.

As can best be seen from FIG. 8, the wire/spring bail 118 has a generally U-shaped configuration and is formed preferably of a metallic material such as stainless steel or the like. The intermediate portion 166 of the bail functions as a handle which is pullable by a conventional shot-gun stick for installation of the unit over the cable 112. The opposing arms 167 of the bail terminates in pin-like engagement members 168a, 168b.

The compression spring 120a has a first end fixedly secured in the opening 158a on the L-shaped clamping bracket 116 and has a second end thereof joined to the engagement member 168a. Similarly, the compression spring 120b has a first end fixedly secured in the opening 158b of the L-shaped clamping bracket 116 and has a second end thereof joined to the engagement member 168b. Thereafter, the distal ends of the engagement members 168a, 168b are inserted through the respective apertures 152 in the rib members 150a and 150b so as to retain the clamping bracket and housing together. In particular, due to the resulting compression force of the springs 120a, 120b the V-shaped section 165 of the shorter leg portion 154 of the clamping bracket 116 will be urged downwardly in contacting engagement against the V-shaped surfaces of the cushion members 140.

The indication device 122 is comprised of a colored, opaque hood 170 and a cylindrically-shaped transparent stem 172 joined to the center of the hood 170 on its lower surface and extending outwardly therefrom. The top outer surface of the hood 170 is mounted to one end of a collar 174 whose other end is suitably formed around a small aperture 176 in the central area of the bottom wall 132 of the housing. The small aperture 176 receives a light-emitting diode (LED) which produces a flashing light to provide a visual indication of the presence of a fault current. The bottom end of the transparent stem 172 includes a concave section 178 through which the light will be transmitted radially outwardly in all directions.

Due to the combination of the hood 170 and the transparent stem 172, the light flashing from the LED will become directly and readily visible through the sides and bottom end of the stem. As a result, it is extremely easy to determine the presence of the fault along the cable to be within a known section since the flashing light will be visually observable at a predetermined distance from all of the sides of the unit as well as from the bottom thereof.

Suitable circuitry for use in the faulted circuit indicator unit 110 of the present invention as the current sensing means for detecting the abnormally high electric current in the cable 112 as well as a driver circuit for rendering conductive the LED in the indication device 122 when there is a presence of a fault current can be of the type described and illustrated in my U.S. Pat. No. 4,101,826 issued on Jul. 18, 1978, which is hereby incorporated by reference.

In FIG. 1 of the '826 patent, there is shown a fault indicator circuit which includes a reed contact 1 of a relay disposed for responding to a magnetic field surrounding a conductor 12 particularly when conducting above-normal current. The reed contact 1, when closed, triggers an electronic latch 4, 5 which enables a counter Z and a pulse generator. A visible signalling device formed of a transistor T and a light-emitting diode is connected to the pulse generator to emit blinking signals in response to pulses when generated by the pulse generator. The counter is also connected to the pulse generator for counting the blinking pulses and for re-setting the latch after a particular number of pulses have been counted. It should be apparent to those skilled in the art that the reed contact 1 could be replaced by a commercially available current sensing transformer for sensing faults in the conductor.

In addition, the faulted circuit indicator unit 110 of the present invention may also include a variable load levelling circuit of the type described and illustrated in application Ser. No. 08/517,734 filed Aug. 21, 1995, in the names of W. Huppertz and H. Horstmann and entitled "Faulted Circuit Indicator With Variable Load Levelling Circuit," which is also incorporated herein by reference. The application Ser. No. 08/517,734 discloses a variable loading levelling circuit which is connected in parallel to the current sensing circuit for regulating the variable output voltage therefrom to be at a constant reference value. A value of the variable output voltage corresponding to a previous load current is stored so as to automatically adjust to different peak loads in order to accommodate a relatively wide range of load currents.

In operation, the user merely utilizes the conventional shot-gun stick which is operatively attached to the bail 118 of the fault circuit indicator unit 110 for expansion of the compression springs 120a, 120b so as to cause the housing 114 to slide downwardly along the longer leg portion 156 of the clamping bracket 116. As a result, the V-shaped surfaces of the cushion members 140 disposed on the lid member 138 will become separated from the inverted V-shaped sections 165 of the shorter leg portion 154 of the clamping bracket 116 so as to create an opening for insertion of the cable 112. Once the expansion force on the springs is released, the cable 112 will be trapped or sandwiched between the V-shaped surfaces of the cushion members 140 and the inverted V-shaped sections 165.

When there is a fault, the flashing light from the light-emitting diode LED will be visible advantageously through the transparent stem 172 in all directions at a relatively large distance, thereby providing an indication of a fault. As a consequence, the time-consuming task of locating the fault by servicing or maintenance personnel will have been substantially reduced. Moreover, the faulted circuit indicator unit of the present invention has the further advantage of being miniaturized and compact in its construction and thus less costly to manufacture and assemble than those currently available.

In FIGS. 9 through 11, there is illustrated a second embodiment of a faulted circuit indicator 210 of the present invention. FIG. 9 shows a front, plan view of the faulted circuit indicator 210. FIG. 10 shows a side elevational view of the faulted circuit indicator. FIG. 11 shows a back, plan view of the faulted circuit indicator. The faulted circuit indicator 210 is substantially identical in its construction to the faulted circuit indicator 110 of FIGS. 2–8, except for the clamping bracket 116 and the wire/spring bail 118. A L-shaped support member 212 has been added and is fixedly secured adjacent to the free end of the longer leg portions 214a and 214b of the clamping bracket 215 by any suitable means, such as rivets 216. The bail 118 is replaced by a narrow handle 218 which extends through the support member 212 and between the leg portions 214a and 214b. The upper end of the handle 218 is fixedly secured to the bottom wall 220 of the housing 222, and the lower end of the handle terminates in an eye portion 224. It will be noted that a short connecting rod 226 is joined to the ends of the compression springs 228a and 228b.

Unlike the faulted circuit indicator 110 of FIGS. 2–8 which requires an adapter of some type to be connected to the wire/spring bail 118 before being usable with the conventional shot-gun stick, the support member 212 of the faulted circuit indicator 210 can be placed directly into the conventional shot-gun stick and the handle 218 can then be pulled via the eye portion 224 so as to install the unit over the cable. Consequently, the faulted circuit indicator 210 has the additional advantage of being easier to install by servicing or maintenance personnel without the need of an adapter.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A faulted circuit indicator unit for detecting an abnormally high electric current in an overhead cable, comprising:

a substantially rectangularly-shaped housing formed of front and back walls, opposed side walls, a closed bottom wall, and an open top mouth portion, said front and back walls, opposed side walls, and closed bottom wall all being integrally connected together so as to define a cavity;

current sensing means disposed in said housing for detecting the high current in the cable;

a lid member for covering the open mouth portion of said housing so as to seal the current sensing means within said housing in a fluid-tight engagement;

an L-shaped clamping bracket formed of a shorter leg portion and a longer leg portion which is joined to the shorter lea portion;

a channel formed in the back wall of said housing which receives slidably therein the longer leg portion of said clamping bracket;

an indication device being joined to the closed bottom wall of said housing and including a visible indicator responsive to said current sensing means to produce a visual flashing light in the presence of the high current which is visible through a small aperture formed in the bottom wall thereof; and said indication device including an opaque hood whose central portion is connected to the bottom wall of said housing and a transparent stem joined also to the central portion of said hood and extending downwardly therefrom through which the flashing light is transmitted radially outwardly in all directions, whereby the flashing light will be visually observable at a predetermined distance from all of the sides of the faulted circuit indicator unit when viewed from below the closed bottom wall of said housing.

2. A faulted circuit indicator unit as claimed in claim 1, wherein said visible indicator is comprised of a light-emitting diode.

3. A faulted circuit indicator unit as claimed in claim 1, wherein said current sensing means includes a reed contact disposed in the magnetic field surrounding the cable in which the high current flowing therethrough is to be monitored.

4. A faulted circuit indicator unit as claimed in claim 1, wherein said current sensing means includes a current sensing transformer disposed in the magnetic field surrounding the cable in which the high current flowing therethrough is to be monitored.

5. A faulted circuit indicator unit as claimed in claim 1, wherein said housing is formed of a molded plastic material.

6. A faulted circuit indicator unit as claimed in claim 1, further comprising handle means operatively connected to the bottom wall of said housing which is utilized directly with a conventional shot-gun stick without the need of an adapter so as to separate said shorter leg portion of said clamping bracket from said lid member in order to receive said cable therebetween.

7. A faulted circuit indicator unit as claimed in claim 1, further comprising compression spring means for resiliently urging said shorter leg portion of said clamping member against said lid member.

8. A faulted circuit indicator unit as claimed in claim 7, further comprising bail means operatively connected to the bottom wall of said housing which is utilized to separate said shorter leg portion of said clamping bracket from said lid member so as to receive said cable therebetween.

9. A faulted circuit indicator unit for detecting an abnormally high electric current in an overhead cable, comprising:

housing means including a cavity formed therein;

current sensing means disposed in said housing means for detecting the high current in the cable;

cover means for sealing said current sensing means within said housing means in a fluid-tight engagement;

clamping bracket means disposed slidably relative to said housing means for securely mounting the cable on top of said cover means;

said clamping bracket means being comprised of an L-shaped clamping bracket;

compression spring means for resiliently urging said clamping bracket means against said cover means;

handle means operatively connected to said housing means for separating said clamping bracket means from the top of said cover means in order to allow insertion of the cable; and indicator means joined to said housing means for transmitting radially outwardly in all directions a visible flashing light in the presence of a high current, whereby the flashing light will be visually observable at a predetermined distance from all of the sides of the faulted circuit indicator unit when viewed from below said housing means.

10. A faulted circuit indicator unit as claimed in claim 9, wherein said indication means includes an opaque hood whose central portion is connected around a bottom wall of said housing means and a transparent stem joined also to the central portion of said hood and extending downwardly therefrom through which the flashing light is transmitted radially outwardly in all directions.

11. A faulted circuit indicator unit as claimed in claim 9, wherein said cover means is comprised of a lid member.

12. A faulted circuit indicator unit as claimed in claim 9, further comprising channel means formed in a back wall of said housing means for receiving said clamping bracket means.

13. A faulted circuit indicator unit as claimed in claim 9, wherein said handle means is utilized directly with a conventional shot-gun stick without the need of an adapter.

\* \* \* \* \*